US012376251B2

(12) United States Patent
Lin et al.

(10) Patent No.: US 12,376,251 B2
(45) Date of Patent: Jul. 29, 2025

(54) ELETRONIC DEVICE

(71) Applicant: WISTRON NEWEB CORPORATION, Hsinchu (TW)

(72) Inventors: Hsin-Chang Lin, Hsinchu (TW); Bo-Yen Chen, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 291 days.

(21) Appl. No.: 18/336,089

(22) Filed: Jun. 16, 2023

(65) Prior Publication Data
US 2024/0098909 A1   Mar. 21, 2024

(30) Foreign Application Priority Data
Sep. 19, 2022   (TW) .................................. 111135274

(51) Int. Cl.
*H05K 5/15*   (2025.01)
(52) U.S. Cl.
CPC ...................... *H05K 5/15* (2025.01)
(58) Field of Classification Search
CPC ....................................................... H05K 5/15
See application file for complete search history.

(56) References Cited

U.S. PATENT DOCUMENTS

| | | | | |
|---|---|---|---|---|
| 5,621,196 A * | 4/1997 | Nishijima | ............ | H01H 25/041 200/6 A |
| 5,828,364 A * | 10/1998 | Siddiqui | ............... | G06F 3/0312 345/163 |
| 7,261,331 B2 * | 8/2007 | Lin | ........................ | E05C 19/163 292/108 |
| 7,414,205 B1 * | 8/2008 | Heinrich | ................ | H01H 19/63 200/336 |
| 10,054,964 B2 * | 8/2018 | Filson | ................. | G05D 23/1902 |
| 2004/0245204 A1 * | 12/2004 | Suffa | ................... | B65D 47/0838 215/218 |
| 2012/0130546 A1 * | 5/2012 | Matas | ................ | B01D 46/0086 700/276 |
| 2017/0154740 A1 * | 6/2017 | Luo | ........................ | H01H 13/023 |
| 2017/0292550 A1 * | 10/2017 | Wang | ...................... | F16B 5/065 |

* cited by examiner

*Primary Examiner* — Abhishek M Rathod
(74) *Attorney, Agent, or Firm* — McClure, Qualey & Rodack, LLP

(57) ABSTRACT

An electronic device includes a first component and a second component. The first component includes a first housing and a protrusion element. The first housing has a first cover plate, and the protrusion element is disposed on the first cover plate. The second component is rotationally assembled with the first component along a first direction. The second component includes a second housing, an elastic structure, and a switching element. The elastic structure has an elastic post. The second housing has a second cover plate having a through hole. One part of the elastic post passes through the through hole and is exposed on the second cover plate. The protrusion element moves along a first direction relative to the elastic structure, such that the elastic post is squeezed by the protrusion element to move along a second direction and presses the switching element.

10 Claims, 10 Drawing Sheets

ELETRONIC DEVICE

CROSS-REFERENCE TO RELATED PATENT APPLICATION

This application claims the benefit of priority to Taiwan Patent Application No. 111135274, filed on Sep. 19, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electronic device, and more particularly to an electronic device capable of detecting whether or not the electronic device is correctly assembled.

BACKGROUND OF THE DISCLOSURE

In order to avoid subsequent problems caused by improper assembly of an electronic device (such as abnormal battery power supply caused by improper assembly), a detection switch is usually mounted inside the electronic device for being pressed by an internal structure of the electronic device. If the electronic device is successfully assembled, the detection switch will be pressed, and the detection switch outputs a signal to inform a user.

In the related art, an existing detection switch is pressed along a forward pressing direction (i.e., a direction that is parallel to the assembling direction of the electronic device). However, the existing detection switch is not suitable for a side-assembled electronic device because the pressing direction of the existing detection switch is perpendicular to an assembling direction of the side-assembled electronic device.

Therefore, how to detect whether or not a side-assembled electronic device is correctly assembled through proper structural design has become one of the important issues to be solved in the related field.

SUMMARY OF THE DISCLOSURE

In response to the above-referenced technical inadequacy, the present disclosure provides an electronic device.

In one aspect, the present disclosure provides an electronic device. The electronic device includes a first component and a second component. The first component includes a first housing and a protrusion element. The first housing has a first cover plate, and the protrusion element is disposed on the first cover plate. The second component is rotationally assembled with the first component along a first direction. The second component includes a second housing, an elastic structure, and a switching element. The elastic structure and the switching element are disposed in the second housing. The elastic structure has an elastic post. The second housing has a second cover plate having a through hole. One part of the elastic post passes through the through hole and is exposed on the second cover plate. The protrusion element moves along a first direction relative to the elastic structure, such that the elastic post is squeezed by the protrusion element to move along a second direction and press the switching element. The first direction is perpendicular to the second direction.

Therefore, in the electronic device provided by the present disclosure, by virtue of "the protrusion element moving along a first direction relative to the elastic structure, such that the elastic post is squeezed by the protrusion element to move along a second direction and pressing the switching element," it can be determined whether or not the side-assembled electronic device is correctly assembled.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
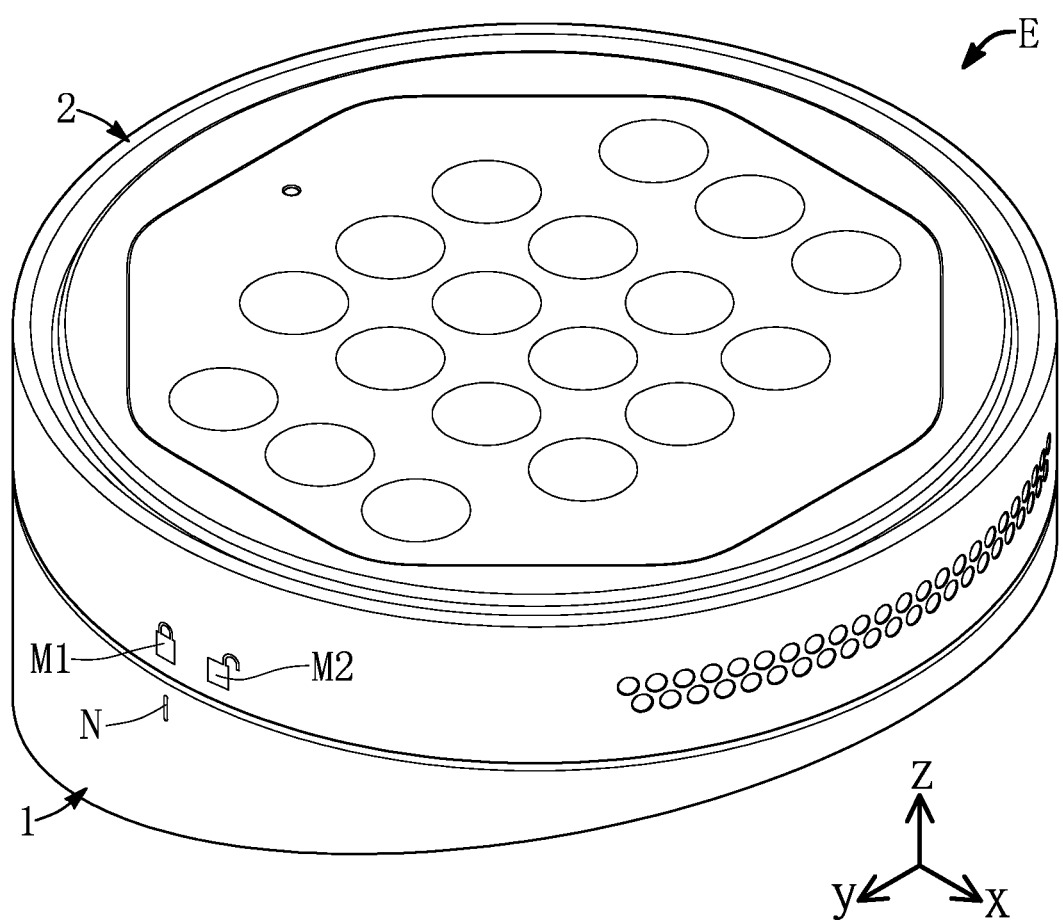
FIG. 1 is a schematic perspective view of an electronic device according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way.

Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like. In addition, the term "connect" or "connected" in the context of the present disclosure means that there is a physical connection between two elements, and the two elements are directly or indirectly connected.

Embodiment

Figure 2:
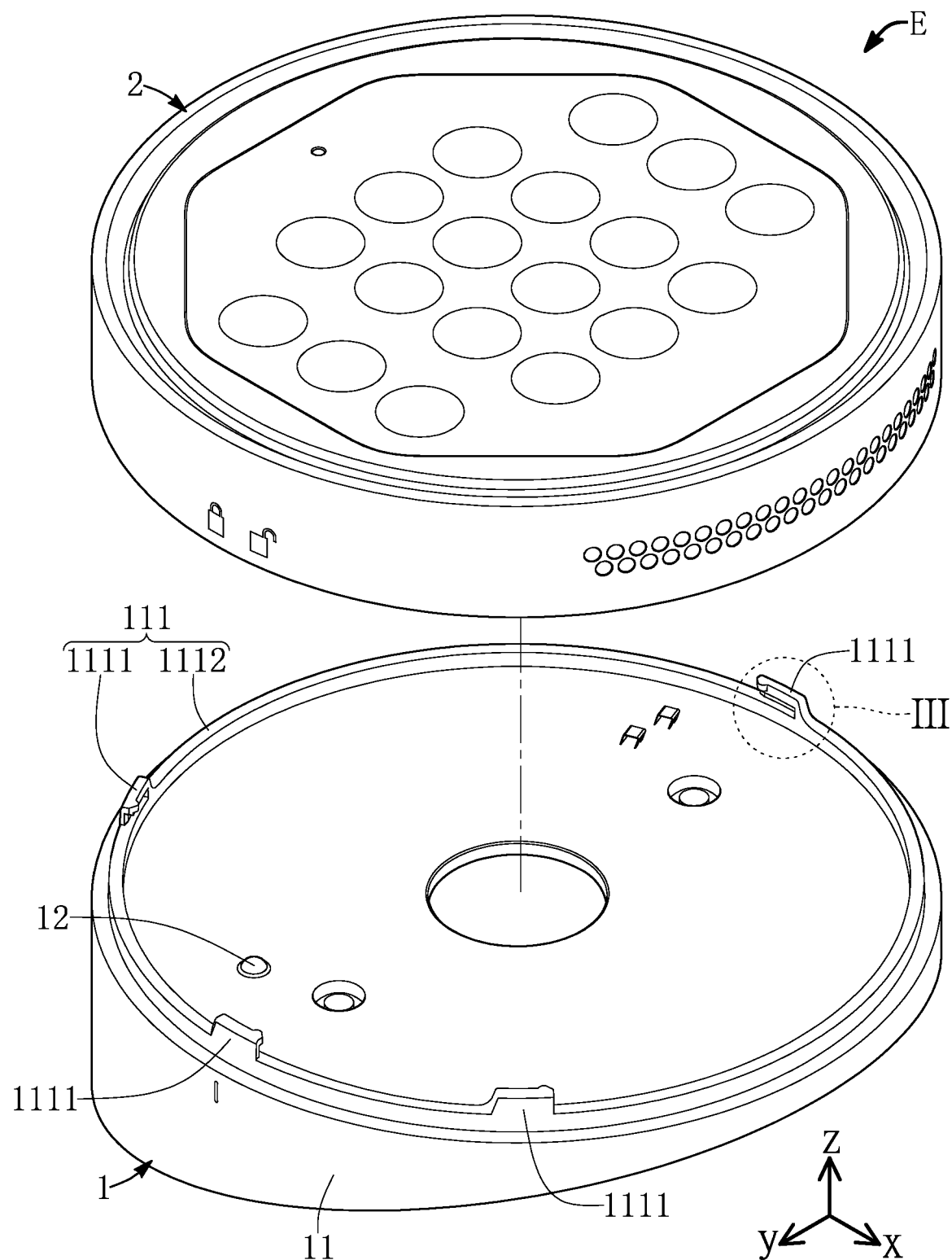
FIG. 2 is a schematic exploded view of the electronic device according to the present disclosure.

Referring to FIG. 1 and FIG. 2, FIG. 1 is a schematic perspective view of an electronic device according to the present disclosure, and FIG. 2 is a schematic exploded view of the electronic device according to the present disclosure. The present disclosure provides an electronic device E, and the electronic device E includes a first component 1 and a second component 2. The first component 1 can be fixed to a wall or shelf. The second component 2 can be assembled with the first component 1 by a way of rotational assembling. Types of the electronic device E, the first component 1, and the second component 2 are not limited in the present disclosure.

Figure 3:
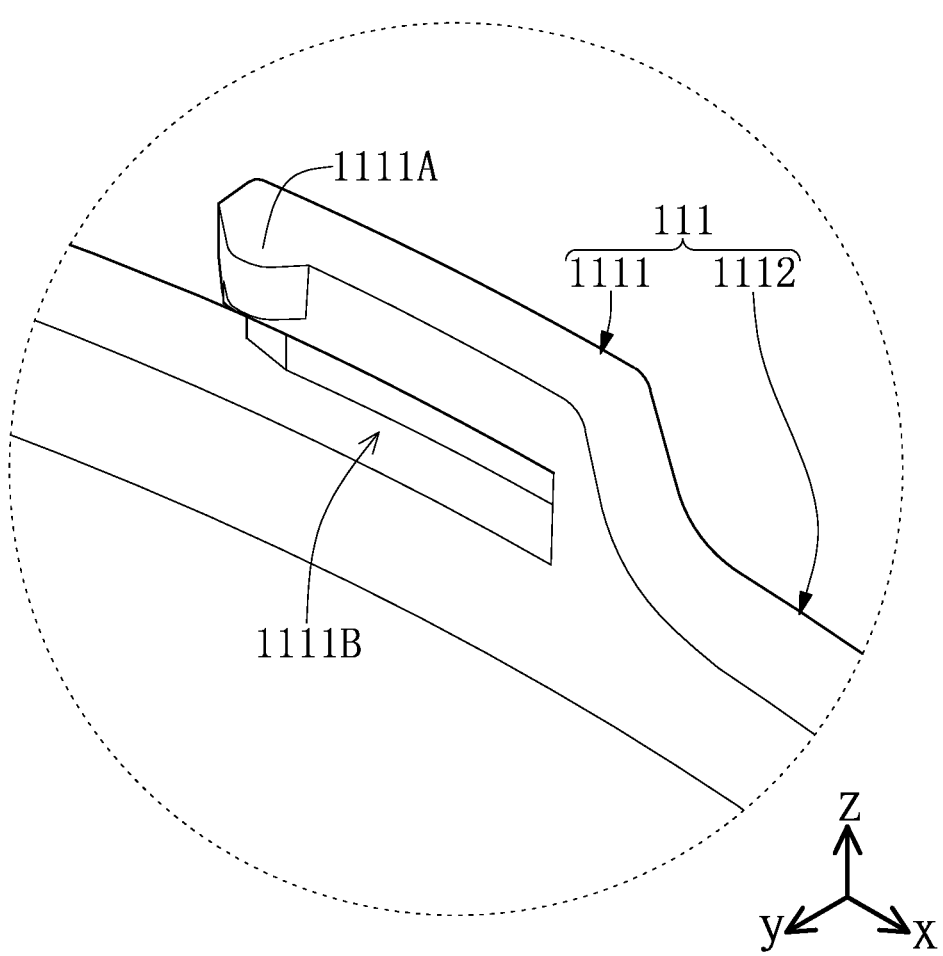
FIG. 3 is a schematic enlarged view of part III of FIG. 2.

Referring to FIG. 2 and FIG. 3, FIG. 3 is a schematic enlarged view of part III of FIG. 2. The first component 1 includes a first housing 11 and a protrusion element 12. The first housing 11 has a first cover plate 111, and the protrusion element 12 is disposed on the first cover plate 111. The first cover plate 111 has a plurality of first limiting structures 1111 disposed at a periphery 1112 of the first cover plate 111. Each of the first limiting structures 1111 includes a first limiting portion 1111A and a third guiding groove 1111B.

Figure 4:
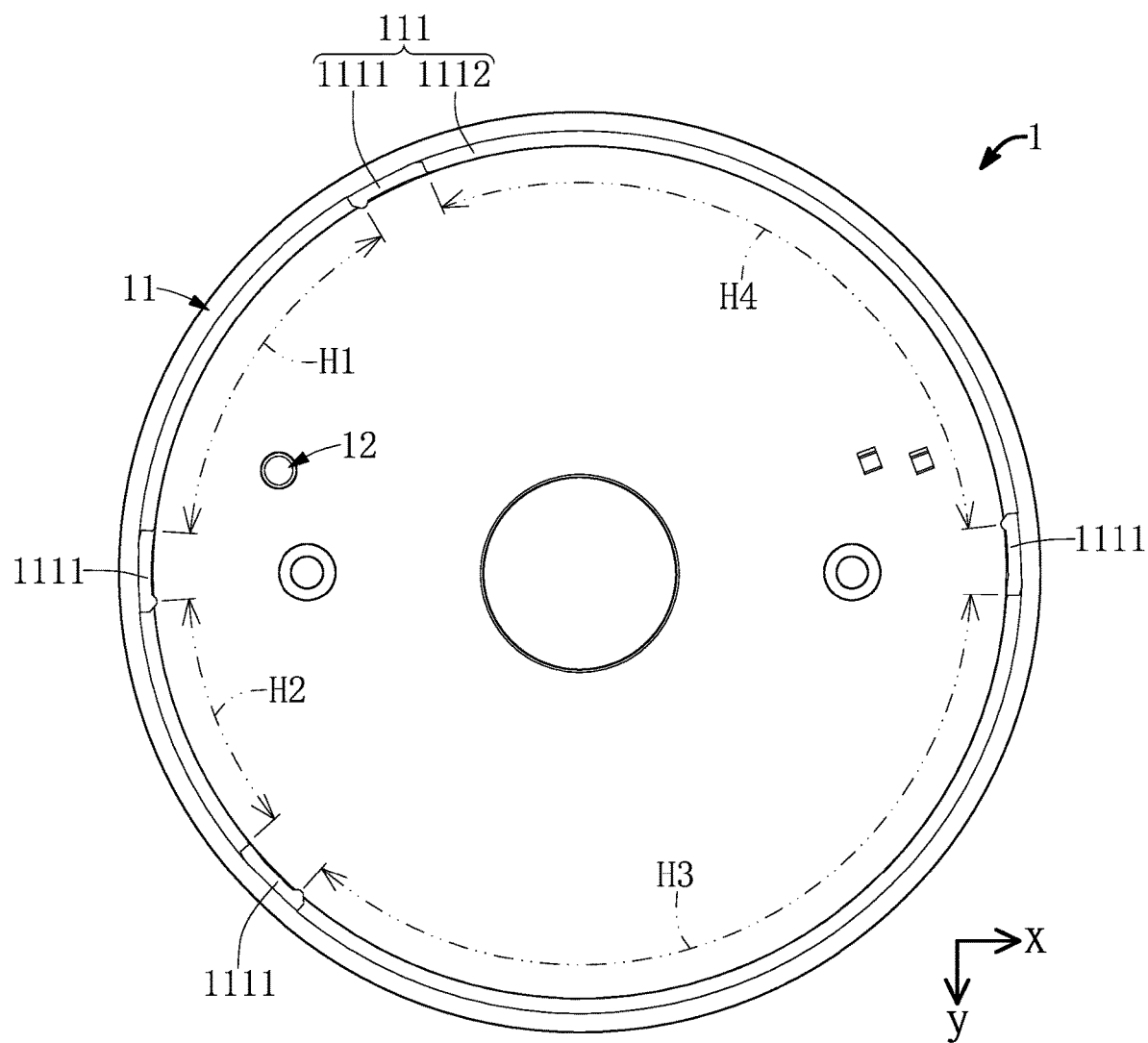
FIG. 4 is schematic top view of a first component of the electronic device according to the present disclosure.

Referring to FIG. 4, FIG. 4 is schematic top view of a first component of the electronic device according to the present disclosure. Specifically, the plurality of first limiting structures 1111 are asymmetrically arranged at the periphery 1112 of the first cover plate 111. Some of the first limiting structures 1111 are collectively arranged on a side edge of the first cover plate 111 closer to the protrusion element 12. The plurality of first limiting structures 1111 are used to divide the periphery 1112 of the first cover plate 111 into a plurality of intervals, and the plurality of intervals are different in size. As shown in FIG. 4, for example, the first cover plate 111 includes four first limiting structures 1111, and three of the four first limiting structures 1111 are collected and close to the protrusion element 12. The four first limiting structures 1111 are used to divide the periphery 1112 of the first cover plate 111 into four intervals H1, H2, H3, and H4. The four intervals H1, H2, H3, and H4 are different in size. Accordingly, different intervals between the limiting structures 1111 can form a foolproof structure, such that the second component 2 can be correctly assembled with the first component 1.

Figure 5:
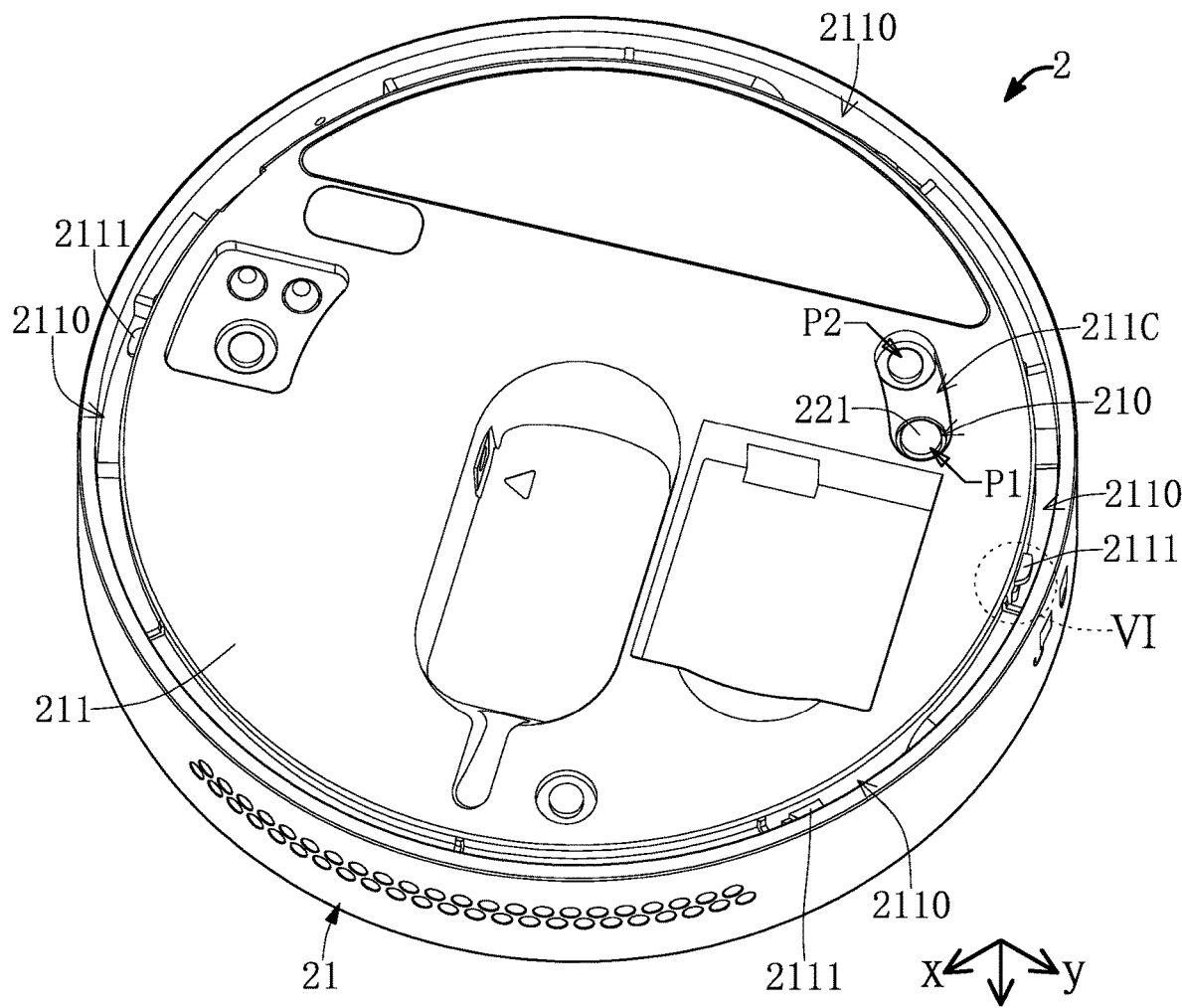
FIG. 5 is a schematic view of a bottom structure of a second component of the electronic device according to the present disclosure.
Figure 6:
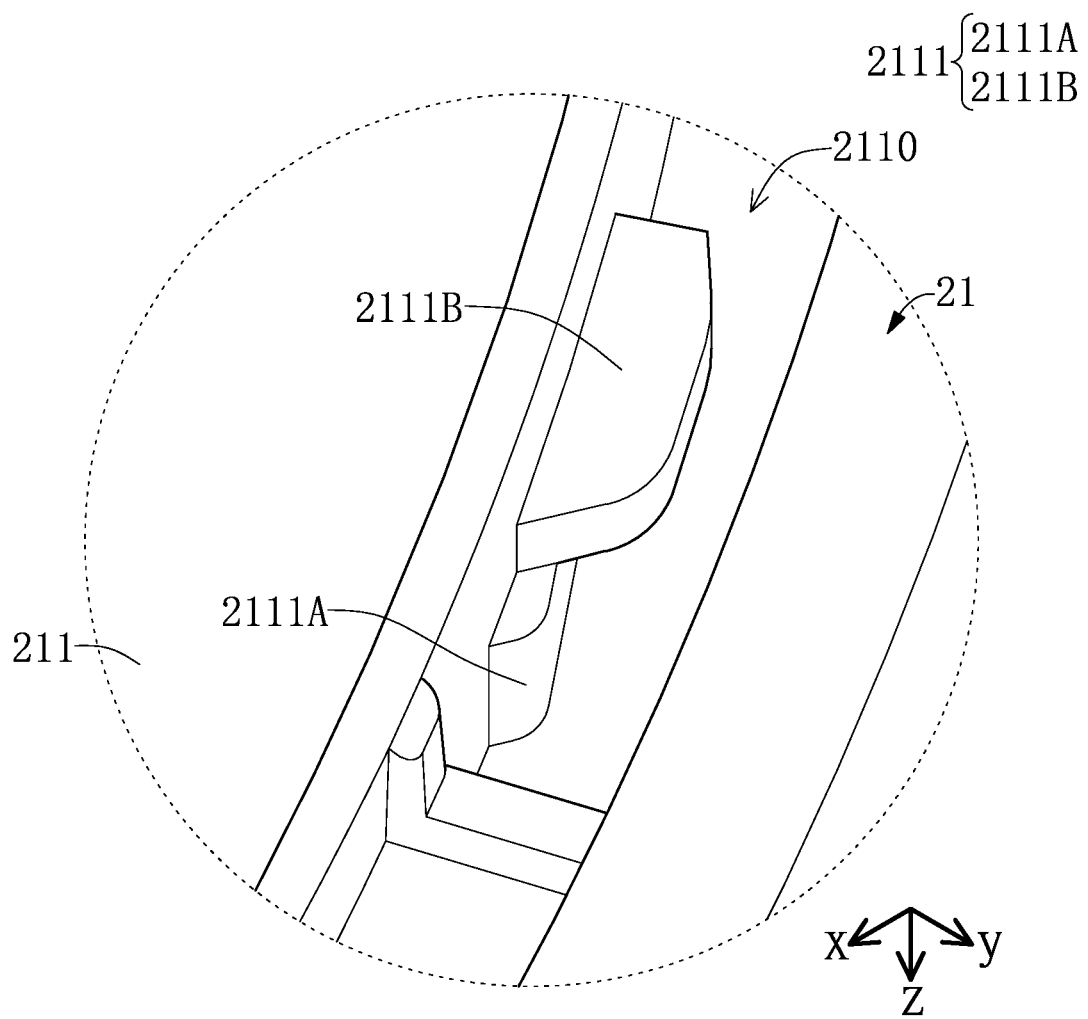
FIG. 6 is a schematic enlarged view of part VI of FIG. 5.
Figure 10:
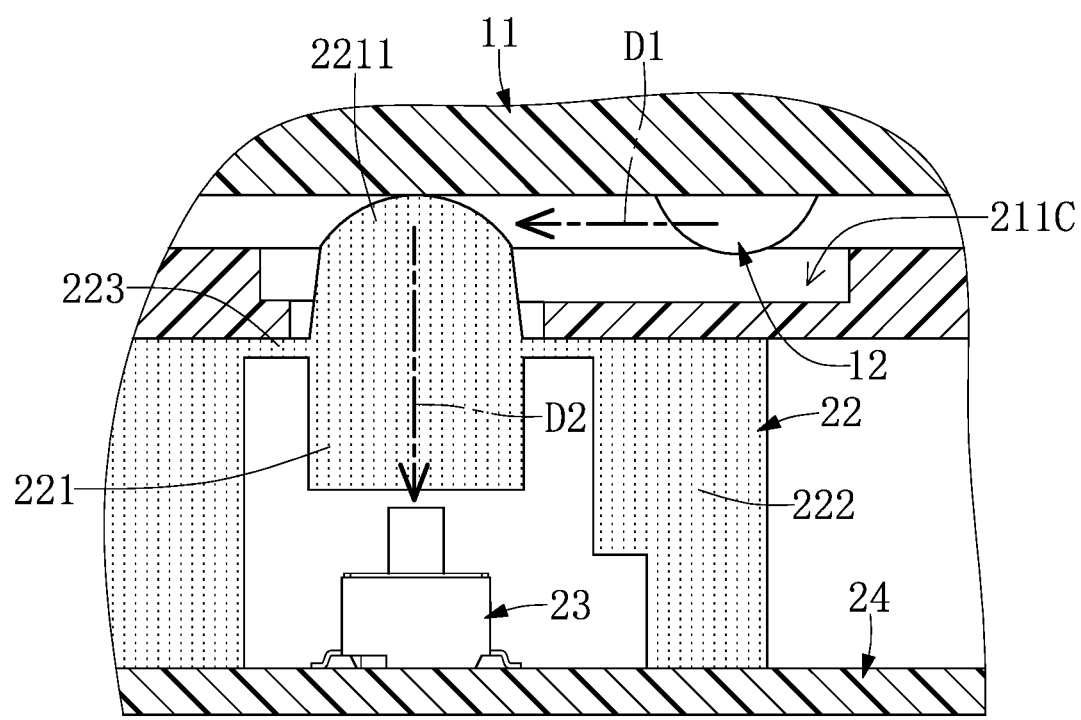
FIG. 10 is a schematic view of an operation between the elastic structure and a protrusion element of the electronic device according to the present disclosure.

Referring to FIG. 5 and FIG. 6, FIG. 5 is a schematic view of a bottom structure of a second component of the electronic device according to the present disclosure, and FIG. 6 is a schematic enlarged view of part VI of FIG. 5. The second component 2 includes a second housing 21, an elastic structure 22, and a switching element 23. Referring to FIG. 10, the elastic structure 22 and the switching element 23 are disposed in the second housing 21. The elastic structure 22 includes an elastic post 221. The second housing 21 includes a second cover plate 211 having a through hole 210. One part of the elastic post 221 passes through the through hole 210 and is exposed on the second cover plate 211.

The second cover plate 211 includes a plurality of first guiding grooves 2110 and a plurality of second limiting structures 2111. Each of the plurality of second limiting structures 2111 includes a plurality of second limiting portions 2111A and a plurality of guiding protrusion blocks 2111B. The plurality of guiding protrusion blocks 2111B are respectively adjacent to the plurality of second limiting portions 2111A. The plurality of first guiding grooves 2110 are formed at a periphery of the second cover plate 211. The plurality of second limiting portions 2111A and the plurality of guiding protrusion blocks 2111B are respectively disposed in the plurality of first guiding grooves 2110. That is to say, each of the first guiding grooves 2110 has a second limiting structure 2111 provided therein.

Figure 7:
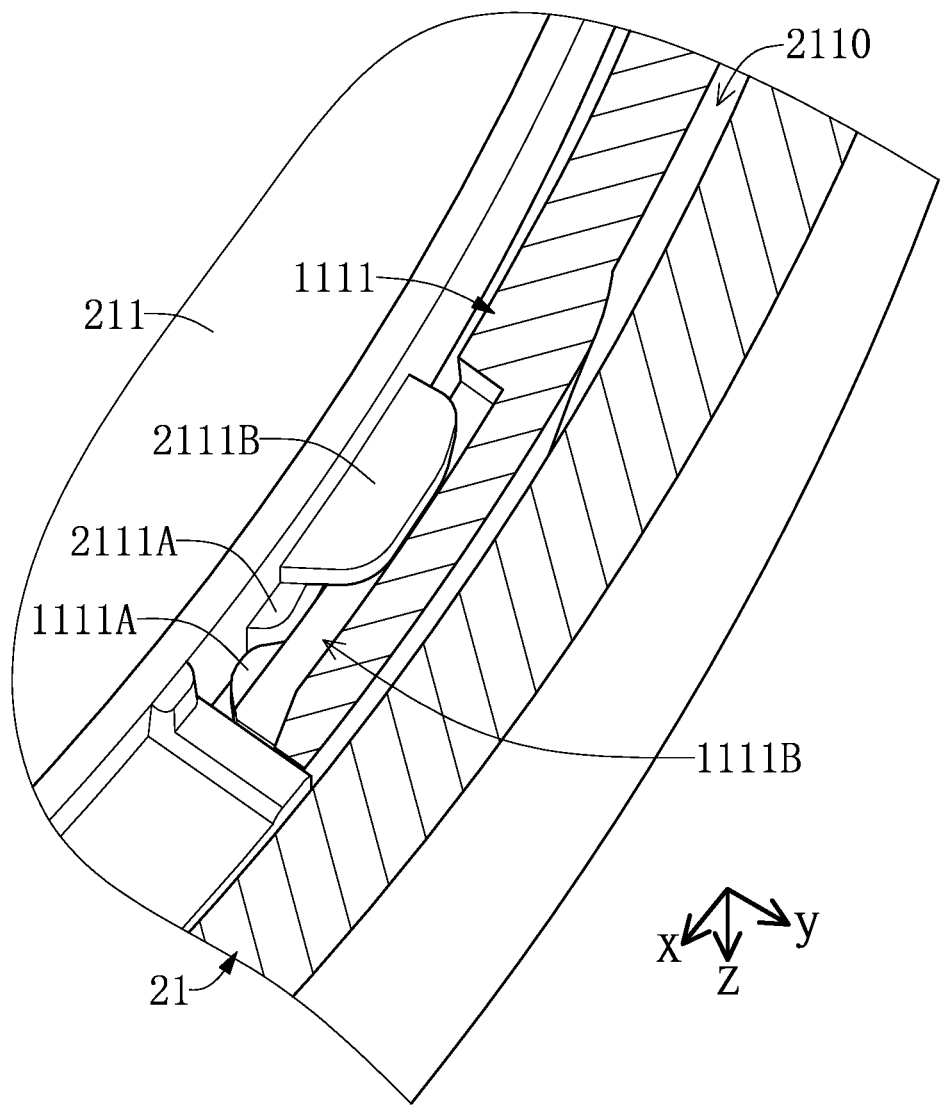
FIG. 7 is a schematic view of a first limiting portion engaging with a second limiting portion in the electronic device according to the present disclosure.

Referring to FIG. 1 and FIG. 7, FIG. 7 is a schematic view of a first limiting portion engaging with a second limiting portion in the electronic device according to the present disclosure. FIG. 7 shows a case in which one of the first limiting structures 1111 is disposed in the corresponding first guiding groove 2110. When the second component 2 is rotationally assembled with the first component 1 along a counterclockwise direction, a marking point N on an outer side of the first component 1 will correspond to a locking symbol M1 on an outer side of the second component 2, the first limiting structures 1111 are respectively arranged in the first guiding grooves 2110, and the first limiting structures 1111 respectively interfere with the second limiting structures 2111. Specifically, the plurality of first limiting portions 1111A respectively interfere with the plurality of second limiting portions 2111A. The plurality of guiding protrusion blocks 2111B are respectively disposed in the plurality of third guiding grooves 1111B. Therefore, the first component 1 and the second component 2 are not easily separated after assembly through the interference structure of the first limiting portions 1111A and the second limiting portions 2111A. In addition, as shown in FIG. 7, surface contours of the plurality of first limiting portions and the plurality of second limiting portions are arc-shaped. In this way, the smoothness of assembly between the second component 2 and the first component 1 can be improved, and the interference between the first limiting portions 1111A and the second limiting portions 2111A does not cause a negative impact on the assembly between the second component 2 and the first component 1.

On the other hand, when the second component 2 is disassembled from the first component 1 along a clockwise direction, the marking point N on the outer side of the first component 1 corresponds to an unlocking symbol M2 on the outer side of the second component 2, each of the first limiting portions 1111A will disengage from the corresponding one of the second limiting portions 2111A, and each of the guiding protrusion blocks 2111B will disengage from the corresponding one of the third guiding grooves 1111B.

Figure 8:
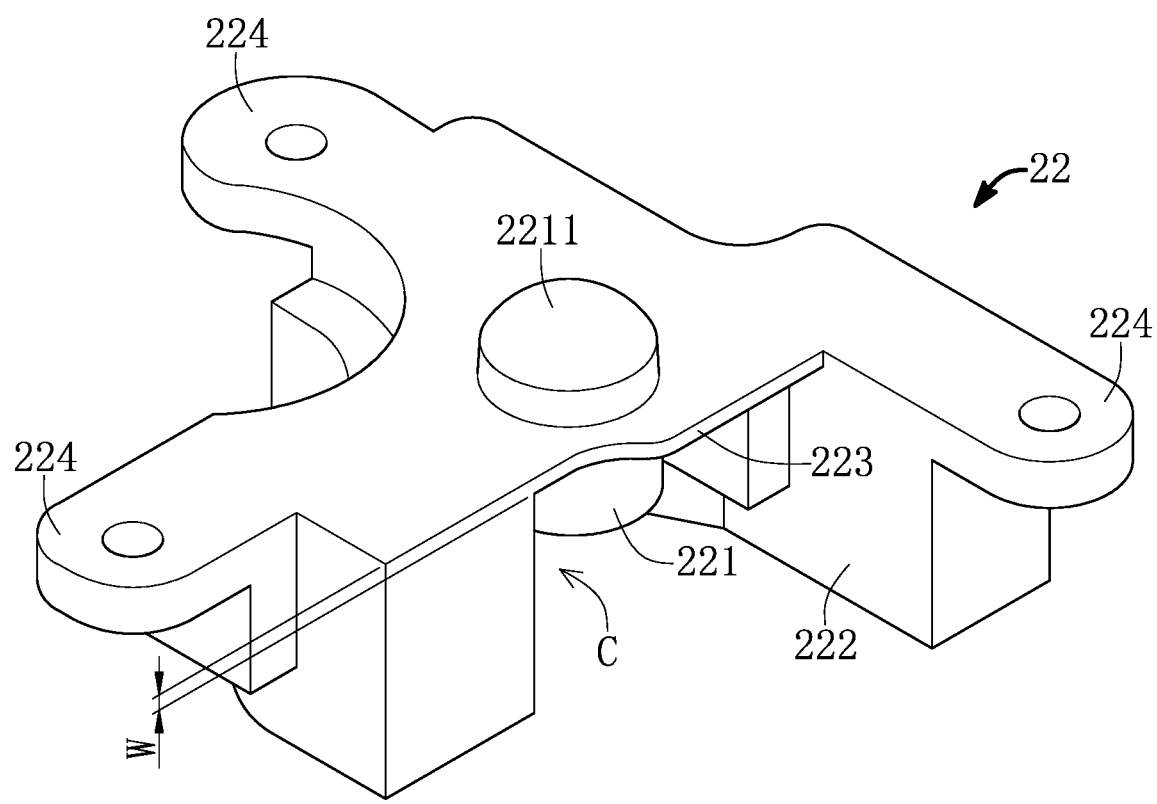
FIG. 8 is a schematic view of an elastic structure of the electronic device according to the present disclosure.
Figure 9:
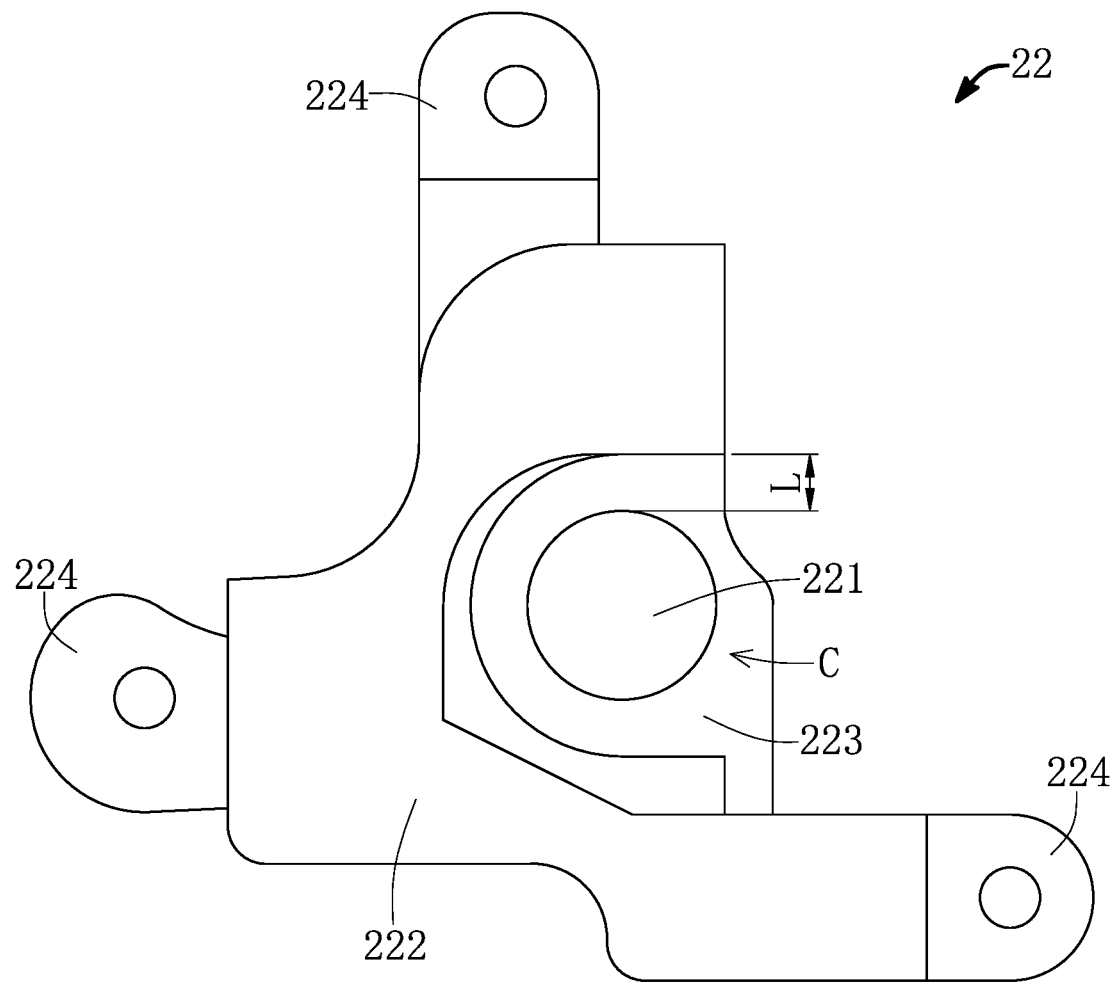
FIG. 9 is a schematic bottom view of the elastic structure of the electronic device according to the present disclosure.

Referring to FIG. 8 and FIG. 9, FIG. 8 is a schematic view of an elastic structure of the electronic device according to the present disclosure, and FIG. 9 is a schematic bottom view of the elastic structure of the electronic device according to the present disclosure. The elastic structure 22 further includes a body portion 222 and an elastic extending portion 223. The body portion 222 surrounds the elastic post 221 to form an accommodating cavity C. The elastic extending portion 223 is a sheet structure connected between the elastic post 221 and the body portion 222. The elastic post 221 has a head portion 2211, and the head portion 2211 passes through the through hole 210 and is exposed on the second cover plate 211. Each shape of the protrusion element 12 and the head portion 2211 has a rounded shape. Moreover, the elastic extending portion 223 has a predetermined length L between the elastic post 221 and the body portion 222, and a ratio of the predetermined length L to a thickness W of the elastic extending portion 223 is greater than or equal to 3.

In addition, the elastic structure 22 further includes a plurality of fixing portions 224 that are connected to an outer side of the body portion 222. The plurality of fixing portions 224 are coplanar and extend along different directions. The elastic structure 22 is used to be steadily fixed on the second cover plate 211 through the plurality of fixing portions 224. For example, each of the fixing portions 224 has a via hole. Each of the fixing portions 224 can be fixed to the second cover plate 211 by a fixing element, such as a pin passing through the via hole. However, the way in which each of the fixing portions 224 is fixed to the second cover plate 211 is not limited in the present disclosure.

Referring to FIG. 5, FIG. 8, and FIG. 10, FIG. 10 is a schematic view of an operation between the elastic structure and a protrusion element of the electronic device according to the present disclosure. The second component 2 further includes a circuit board 24 that is disposed in the second housing 21. As shown in FIG. 10, the switching element 23 is connected onto the circuit board 24, and the switching element 23 is located in the accommodating cavity C. The elastic structure 22 is disposed between the circuit board 24 and the second cover plate 211, and the circuit board 24 and the second cover plate 211 sandwich the elastic structure 22 therebetween. Two ends of the body portion 222 are respectively connected to the second housing 21 and the circuit board 24. The second cover plate 211 further includes a second guiding groove 211C. The second guiding groove 211C is a strip-shaped groove in which a first position P1 and a second position P2 are defined. The through hole 210 is located at the first position P1.

When the second component 2 is rotationally assembled with the first component 1, the second component 2 covers the first component 1, and then the second component 2 rotates counterclockwise relative to the first component 1 to engage with the first component 1. When the second component 2 covers the first component 1, the protrusion element 12 is disposed in the second guiding groove 211C and is located at the second position P2, and the head portion 2211 of the elastic post 221 that is exposed from the through hole 210 is located at the first position P1 of the second guiding groove 211C. Then, when the second component 2 rotates counterclockwise relative to the first component 1 to engage with the first component 1, the protrusion element 12 in the second guiding groove 211C moves along a first direction D1 (as shown in FIG. 10) relative to the elastic structure 22, and the protrusion element 12 moves from the second position P2 to the first position P1 to push the head portion 2211 of the elastic post 221, so that the elastic post 221 then moves along a second direction D2 to press the switch element 23. The first direction D1 is perpendicular to the second direction D2. In this way, when the second component 2 is rotationally assembled with the first component 1, the protrusion element 12 moves laterally in the first direction D1, and then the elastic post 221 is squeezed to be positively moved in the second direction D2 so as to press the switching element 23. In addition, the protrusion 12 can smoothly press the head portion 2211 by the structural design of the head portion 2211 and the protrusion element 12 being rounded. Furthermore, through the structural design of the ratio of the predetermined length L to the thickness W of the elastic extending portion 223 being greater than or equal to 3, the elasticity of the elastic extending portion 223 can be ensured, so as to reduce the probability of permanent deformation and prevent the elastic extension portion 223 from being excessively long to inadvertently press the switch element 23.

In addition, a displacement of each of the second limiting portions 2111A in the corresponding second guiding groove 211C corresponds to a displacement of the protrusion element 12 in the first guiding groove 2110. Therefore, when the protrusion element 12 moves from the second position P2 to the first position P1 and squeezes the elastic post 221, the first component 1 is able to be successfully engaged with the second component 2. In other words, the plurality of first limiting portions 1111A respectively interfere with the plurality of second limiting portions 2111A. After the switch element 23 is pressed, the switch element 23 outputs an electronic signal to a prompt element (not shown in the figures) in the electronic device E. The prompt element can be, for example, a light-emitting diode (LED) element or a buzzer, which can emit light or sound to notify a user that the assembly between the second component 2 and the first component 1 has been completed.

Beneficial Effects of the Embodiment

In conclusion, in the electronic device E provided by the present disclosure, by virtue of "the protrusion element 12 moving along a first direction D1 relative to the elastic structure 22, such that the elastic post 221 is squeezed by the protrusion element 12 to move along a second direction D2 and pressing the switching element 23," it can be determined whether or not the side-assembled electronic device is correctly assembled.

Furthermore, when the second component 2 is rotationally assembled with the first component 1, the protrusion element 12 moves laterally in the first direction D1, and then the elastic post 221 is squeezed to be positively moved in the second direction D2 so as to press the switching element 23. In addition, the protrusion 12 can smoothly press the head portion 2211 by the structural design of the head portion 2211 and the protrusion element 12 being rounded. Furthermore, the elasticity of the elastic extending portion 223 can be ensured through the structural design of the ratio of the predetermined length L to the thickness W of the elastic extending portion 223 being greater than or equal to 3, the elasticity of the elastic extending portion 223 can be ensured, so as to reduce the probability of permanent deformation and prevent the elastic extension portion 223 from being excessively long to inadvertently press the switch element 23.

Moreover, the first component 1 and the second component 2 are not easily separated after assembly through the interference structure of the first limiting portions 1111A and the second limiting portions 2111A. In addition, as shown in FIG. 7, surface contours of the plurality of first limiting portions and the plurality of second limiting portions are arc-shaped. In this way, the smoothness of assembly between the second component 2 and the first component 1 can be improved, and the interference between the first limiting portions 1111A and the second limiting portions 2111A does not cause a negative impact on the assembly between the second component 2 and the first component 1.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device, comprising:
    a first component including a first housing and a protrusion element, wherein the first housing has a first cover plate, and the protrusion element is disposed on the first cover plate; and
    a second component rotationally assembled with the first component along a first direction, wherein the second component includes a second housing, an elastic structure, and a switching element; wherein the elastic structure and the switching element are disposed in the second housing, the elastic structure includes an elastic post, the second housing includes a second cover plate having a through hole, and one part of the elastic post passes through the through hole and is exposed on the second cover plate;
    wherein the protrusion element moves along the first direction relative to the elastic structure, such that the elastic post is squeezed by the protrusion element to move along a second direction and presses the switching element, and the first direction is perpendicular to the second direction,
    wherein the second component further includes a circuit board, the circuit board is disposed in the second housing, and the switching element is connected onto the circuit board; wherein the elastic structure further includes a body portion and an elastic extending portion, the elastic structure is disposed between the circuit board and the second cover plate, and two ends of the body portion are respectively connected to the second housing and the circuit board; wherein the body portion surrounds the elastic post to form an accommodating cavity, the switching element is located in the accommodating cavity, the elastic extending portion is connected between the elastic post and the body portion, the elastic post has a head portion, and the head portion passes through the through hole and is exposed on the second cover plate.

2. The electronic device according to claim 1, wherein the elastic structure further includes a plurality of fixing portions that are connected to an outer side of the body portion, the plurality of fixing portions are coplanar and extend along different directions, and the elastic structure is used to be fixed on the second cover plate through the plurality of fixing portions.

3. The electronic device according to claim 1, wherein the elastic extending portion has a predetermined length between the elastic post and the body portion, and a ratio of the predetermined length to a thickness of the elastic extending portion is greater than or equal to 3.

4. The electronic device according to claim 1, wherein each of the protrusion element and the head portion of the elastic post has a rounded shape.

5. The electronic device according to claim 1, wherein the first cover plate includes a plurality of first limiting structures, the plurality of first limiting structures are disposed at a periphery of the first cover plate, and the plurality of first limiting structures has a plurality of first limiting portions, respectively; wherein the second cover plate includes a plurality of first guiding grooves and a plurality of second limiting portions, the plurality of first guiding grooves are formed on a periphery of the second cover plate, and the plurality of second limiting portions are disposed in the plurality of first guiding grooves, respectively; wherein, when the second component is rotationally assembled with the first component, the plurality of first limiting portions are respectively disposed in the plurality of first guiding grooves and respectively interfere with the plurality of second limiting portions.

6. The electronic device according to claim 5, wherein the plurality of first limiting structures are asymmetrically arranged at the periphery of the first cover plate, and the plurality of first limiting structures are used to divide the periphery of the first cover plate into a plurality of intervals that are different in size.

7. The electronic device according to claim 5, wherein the second cover plate further includes a second guiding groove having a first position and a second position, and the through hole is located at the first position; wherein, when the second component is rotationally assembled with the first component, the protrusion element is disposed in the second guiding groove; wherein, when the plurality of first limiting portions respectively interfere with the plurality of second limiting portions, the protrusion element moves from the second position to the first position and squeezes the elastic post, such that the switching element is pressed by the elastic post.

8. The electronic device according to claim 7, wherein a displacement of each of the second limiting portions in the corresponding second guiding groove corresponds to a displacement of the protrusion element in the first guiding groove.

9. The electronic device according to claim 7, wherein the first cover plate further includes a plurality of third guiding grooves respectively disposed adjacent to the plurality of first limiting portions, and the second cover plate further includes a plurality of guiding protrusion blocks respectively disposed adjacent to the plurality of second limiting portions; wherein, when the second component is rotationally assembled with the first component, the plurality of guiding protrusion blocks are respectively disposed in the plurality of third guiding grooves.

10. The electronic device according to claim 7, wherein surface contours of the plurality of first limiting portions and the plurality of second limiting portions are arc-shaped.

* * * * *